United States Patent [19]

Herrmann et al.

[11] 3,952,243

[45] Apr. 20, 1976

[54] VOLTAGE TRANSFORMER FOR A HIGH VOLTAGE SWITCHING APPARATUS

[75] Inventors: Albert Herrmann; Gerhard Kleen; Heinz Schiemann, all of Berlin, Germany

[73] Assignee: Siemens Aktiengesellschaft, Munich, Germany

[22] Filed: May 17, 1974

[21] Appl. No.: 470,983

[30] Foreign Application Priority Data

May 17, 1973 Germany............................ 2325438

[52] U.S. Cl.............................. 323/44 R; 174/27; 174/99 R; 307/147; 307/148
[51] Int. Cl.²...................... H01B 9/06; H01F 27/00
[58] Field of Search ............. 307/147, 149; 323/93, 323/44 R; 174/27, 28, 99 R, 99 B; 336/174, 175

[56] References Cited
UNITED STATES PATENTS

| 3,585,270 | 6/1971 | Trump ................................ 174/28 |
| 3,621,109 | 11/1971 | Nakata.................................. 174/28 |
| 3,701,944 | 10/1972 | Amalric.......................... 174/11 BH |
| 3,763,378 | 10/1973 | Muller .............................. 323/93 X |
| 3,829,742 | 8/1974 | Muller ............................... 323/93 X |

*Primary Examiner*—Gerald Goldberg
*Attorney, Agent, or Firm*—Kenyon & Kenyon Reilly Carr & Chapin

[57] ABSTRACT

A voltage transformer for an insulated high-voltage switching apparatus of the type including a metallic outer tubular casing in which an electrical conductor is disposed, and a tubular sleeve disposed about the conductor within the casing. The sleeve forms both a surface type electrode and in conjunction with the electrical conductor of the apparatus, a high potential capacitor. The improvement of the invention comprises a coupling arrangement, fabricated of electrical insulation material, which is fastened at one end of the tubular sleeve and is coupled to the casing of the apparatus. A support arrangement, also fabricated of electrical insulation material, is fastened at the other end of the tubular sleeve and disposed in engagement with the inner surface of the apparatus casing. The coupling and support arrangements function in conjunction with each other to support the tubular sleeve in the apparatus casing about the electrical conductor.

9 Claims, 4 Drawing Figures

VOLTAGE TRANSFORMER FOR A HIGH VOLTAGE SWITCHING APPARATUS

BACKGROUND OF THE INVENTION

This invention relates to an improved voltage transformer for a metal-encapsulated high-voltage switching apparatus of the type which includes a cylindrical sleeve forming a surface-type electrode disposed about a high-voltage conductor of the apparatus in conjunction with which a high-potential capacitor of a voltage divider is formed. Such a voltage divider also includes a low-potential capacitor, connected to the high-potential capacitor and to an amplifier and a load coupled to the amplifier output. In such voltage transformers, attachment of the sleeve to the metallic casing of the apparatus is unnecessarily complicated, thus increasing the manufacturing expenses incurred in producing such apparatus. A more simple arrangement for mounting the sleeve within the casing is therefore desirable.

SUMMARY OF THE INVENTION

It is therefore an object of this invention to provide an improved voltage transformer for a high-voltage switching apparatus which overcomes the aforementioned disadvantages of prior art devices and moreover is more simple and cost effective in design.

These and other objects are achieved by a voltage transformer for an insulated high-voltage switching apparatus of the type including a metallic outer tubular casing in which an electrical conductor is disposed, and a tubular sleeve disposed about the conductor within the casing. The sleeve forms a surface type electrode and, additionally, a high-potential capacitor in conjunction with the electrical conductor of the apparatus. The improvement of the invention comprises coupling means fabricated of electrical insulation material fastened at one end of the sleeve and coupled to the switching apparatus casing, and support means fabricated of electrical insulation material, fastened at the other end of the sleeve and disposed in engagement with the inner surface of the casing. The coupling and support means function in conjunction with each other to support the sleeve in the apparatus casing about the high-voltage conductor.

The advantage of the inventive voltage transformer is primarily that it can be produced in a cost-effective manner for high-voltage switching systems since insulation members are not used to support the surface-type electrode. In prior art systems, insulation members are used to support the surface electrodes thereof and have large dimensions when adapted for high voltage applications. Such prior art systems are, thus, relatively expensive. Another advantage of the inventive voltage transformer is that the surface electrode expands in only one direction without warping in response to temperature variations, and thus changes in the capacitance of the high-potential capacitor are eliminated. These and other features of the inventive voltage transformer are described in further detail in the following detailed description.

DETAILED DESCRIPTION

Figure 1:
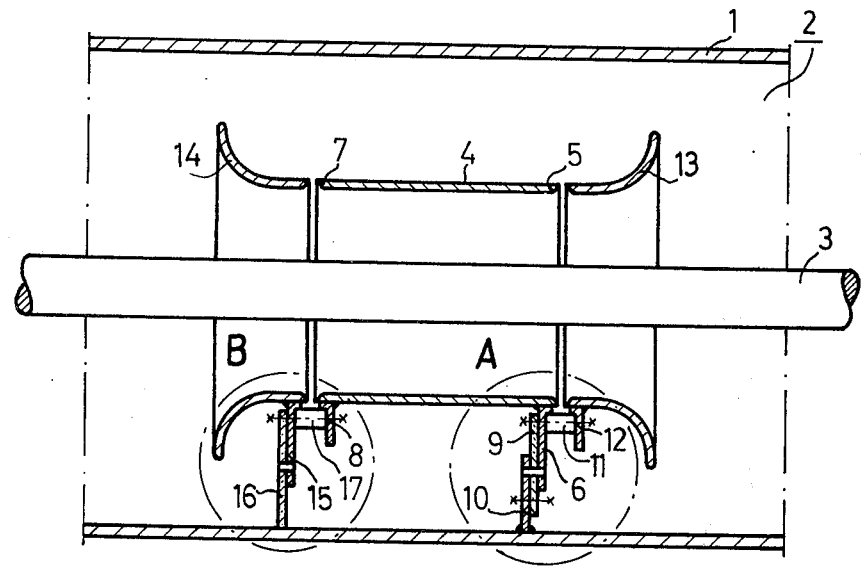
FIG. 1 is a cross-sectional side view of an improved voltage transformer constructed according to the invention.

Referring now to the drawings, and in particular to FIG. 1, there is shown a cylindrical casing 1 of a high-voltage switching apparatus generally designated 2, in which a high-voltage electrical conductor 3 is disposed. Conductor 3 is surrounded by a tubular sleeve 4 which forms a surface electrode of the transformer and includes fastening shoulders 6 and 8 at ends 5 and 7 thereof. A coupling member 9 fabricated of electrical insulation material is fastened to shoulder 6, the latter also being attached to a fastening projection 10 disposed on the inner surface of tube 1. A guard ring electrode comprising a tubular end sleeve 13 and including a fastening lug 12 is clamped to fastening shoulder 6 and coupling member 9 and is spaced apart therefrom by a spacer member 11.

A second tubular end sleeve 14 is coupled to the other end of sleeve 4 and is secured in casing 1 by another fastening lug 15 attached to sleeve 14 and a support member 16 also fabricated of electrical insulation material which engages the inner surface of casing 1. Another spacer member 17 fabricated of electrical insulation material separates lug 15 from an additional fastening shoulder 8 provided on sleeve 4 to which lug 15 is clamped. The illustrated coupling and support members and the fastening shoulders and lug are provided at several points about the circumference of sleeve 4, preferably three points, and are uniformly distributed.

Figures 2, 3:
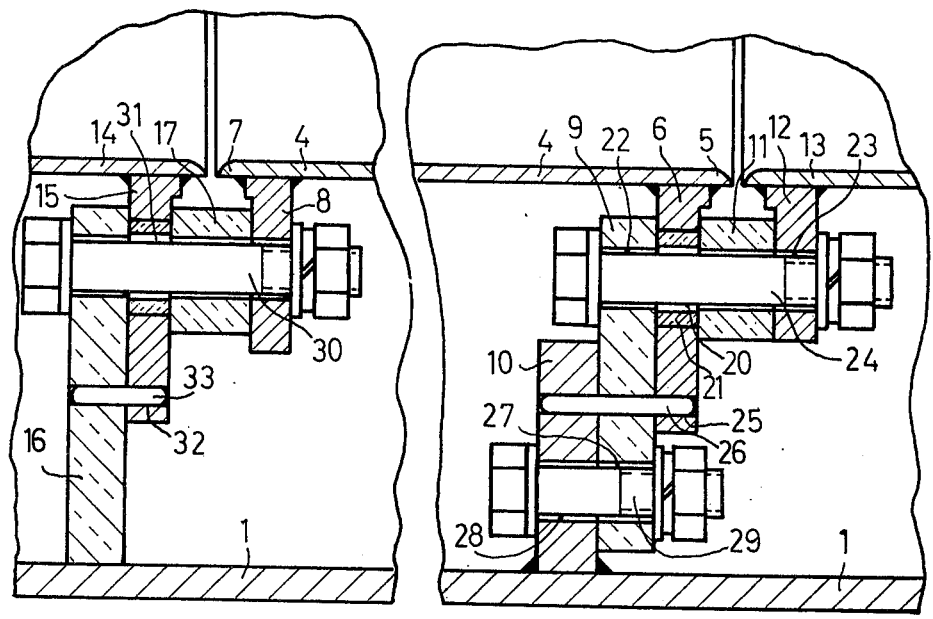
FIG. 2 is a cross-sectional view of the coupling means of the transformer, designated section A in FIG. 1.
FIG. 3 is a cross-sectional view of the support means of the transformer, designated section B in FIG. 1.

The fastening of sleeve 4 at end 5 is shown in detail in FIG. 2. Shoulder 6 of sleeve 4 has an aperture 20 in which an annular ring 21 fabricated of electrical insulation material is disposed. Coupling member 9 is also provided with an aperture 22 while fastening lug 12 includes an aperture 23. Spacer member 11 is disposed between lug 12 and shoulder 6, and coupling member 9, fastening shoulder 6, spacer member 11 and fastening lug 12 are clamped together by bolts 24 disposed through apertures 20, 22 and 23. The diameter of each of the apertures is preferably greater than the outside diameter of the shank of bolts 24 so that after sleeve 4 is installed it may be centered with respect to high-voltage conductor 3. This centering may be achieved by means of a centering piece disposed on conductor 3. A common aperture 25 extends through fastening projection 10, coupling member 9 and fastening shoulder 6 and receives a pin 26 therethrough for centering the sleeve with respect to the conductor. Generally speaking, aperture 25 is first drilled with sleeve 4 in its centered position, pin 26 inserted, and then bolt 24 tightened to secure the sleeve in its centered position. Coupling member 9 also includes at its end adjacent to casing 1 an aperture 27 which is disposed adjacent another aperture 28 provided in fastening projection 10. The coupling member is clamped to fastening projection 10 by means of a bolt 29 disposed through the respective apertures.

FIG. 3 illustrates in detail the attachment of sleeve 4 at end 7. Shoulder 8 on sleeve 4 is separated by spacer member 17 from fastening lug 15 and is clamped to lug 15 and support member 16 by bolt 30. For centering purposes, fastening lug 15 includes an aperture 31 which has a greater diameter than that of the shank of the bolt 30. Another aperture 32 is also provided in lug 15 and support member 16 for receiving another alignment pin 33. Pin 33 secures end sleeve 14 and sleeve 4 in their centered positions. Sleeve 4 and high-voltage conductor 3 together form a cylindrical capacitor having a defined capacitance. Support member 16 can, of course, also be fastened at end 7 of sleeve 4 to fastening shoulder 8 in the manner illustrated in FIG. 2.

Figure 4:
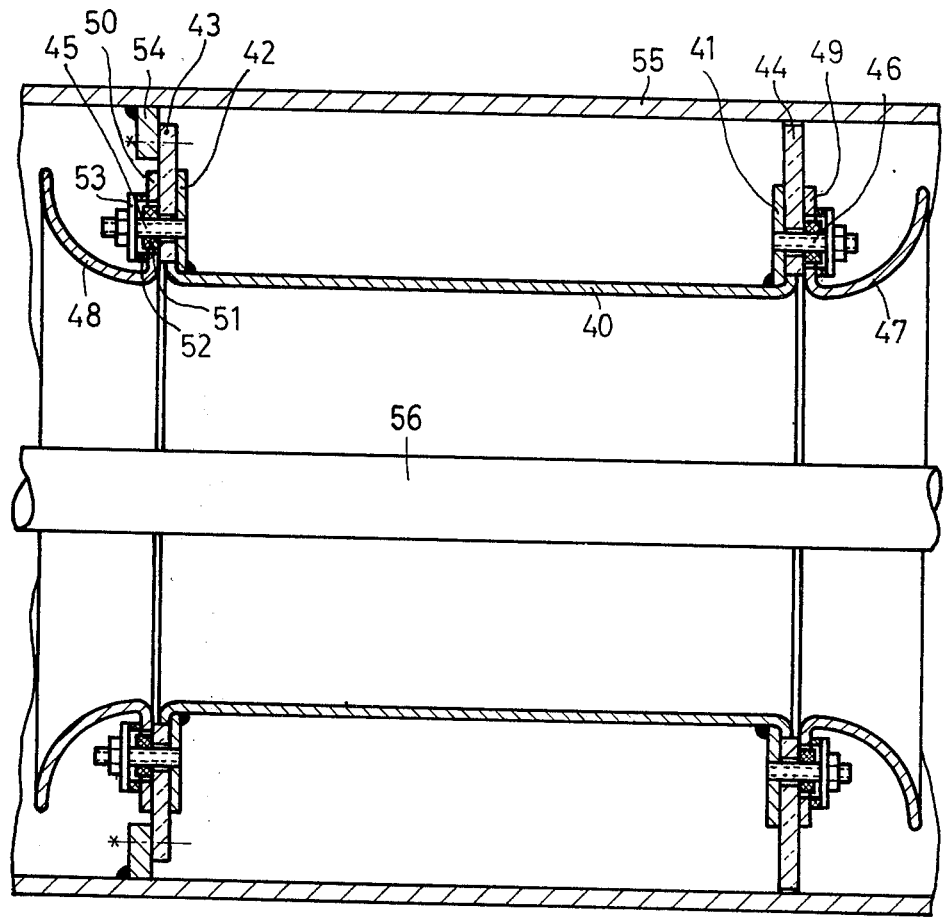
FIG. 4 is a cross-sectional view of another embodiment of a voltage transformer constructed according to the invention.

FIG. 4 illustrates another embodiment of the voltage transformer of the invention in which a sleeve 40 is provided at both ends with fastening shoulders 41 and 42. Coupling members 43 and support members 44 are clamped to shoulders 41 and 42 by means of bolts 45 and 46. These bolts, in addition, secure end sleeves 47 and 48, which form a pair of guard ring electrodes, to sleeve 40. Flanges 49 and 50 of the end sleeves function as fastening lugs and include apertures for receiving the shanks of bolts 45 and 46. Each of these apertures includes a first spacer ring 51 fabricated of electrical insulation material, and a second spacer ring 52 engaged by a washer 53 and clamped by means of bolts 45 and 46. This arrangement electrically insulates sleeves 47 and 48 from fastening shoulders 41 and 42 of sleeve 40, so that end sleeves 47 and 48 may effectively function as guard ring electrodes. Coupling members 43 are each fastened to a fastening projection 54 attached to casing 55 of the switching apparatus. This attachment may be by any suitable fastening means, such as bolts. The support members 44 are not attached to casing 55, but rather merely rest against it. Sleeve 40 can thus expand freely in its axial direction, a feature which prevents deformation of the sleeve. The centering of sleeve 40 and end sleeves 47 and 48 relative to high-voltage conductor 56 is achieved after installation in the same manner as described with reference to the previous embodiments of the invention, that is, by providing apertures of sufficient diameter in the fastening shoulders of sleeve 40 or the flanges of end sleeves 47 and 48.

In the foregoing specification, the invention has been described with reference to specific exemplary embodiments thereof. It will however, be evident, that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a voltage transformer for an insulated high-voltage switching apparatus of the type including a metallic outer tubular casing in which an electrical conductor is disposed and a tubular sleeve disposed about the conductor within the casing, said sleeve forming a surface type electrode and further a high-potential capacitor in conjunction with the conductor, the improvement comprising at least one connecting member made of electrical insulation material, said connecting member being fastened to one end of said sleeve and to the inner wall of said tubular casing thereby fixedly attaching said sleeve to said casing at said one end; and, at least one supporting member made of electrical insulating material, said supporting member being disposed at the other end of said sleeve for bracing said sleeve against said inner wall of said tubular casing so as to permit said sleeve to expand in response to temperature variations without warping; said connecting member and said supporting member being dimensioned so as to conjointly support said sleeve in said casing about said electrical conductor in spaced relation to both said electrical conductor and said casing.

2. The voltage transformer recited in claim 1, wherein said coupling means and said support means are uniformly distributed over the circumference of said sleeve.

3. The voltage transformer recited in claim 1, wherein said coupling means comprises a first fastening shoulder coupled to said sleeve including at least one aperture, a fastening projection coupled to the inner surface of said casing and including at least one aperture, a coupling member fabricated of electrical insulation material having apertures at opposing ends thereof alignable with said apertures in said fastening projection and said fastening shoulder, and fastening means disposed through said apertures provided in said fastening shoulder, fastening projection, and said coupling member, for clamping said shoulder, projection and coupling member together and thereby fastening said sleeve to said casing.

4. The voltage transformer recited in claim 3, wherein said support means comprises a second fastening shoulder coupled to said sleeve and including at least one aperture, a support member fabricated of electrical insulation material and including at least one aperture alignable with said aperture in said second fastening shoulder, and fastening means disposed through said apertures in said shoulder and support member for clamping said shoulder and member together, said support member being disposed in engagement with said inner surface of said casing for supporting said sleeve relative thereto.

5. The voltage transformer recited in claim 4, wherein said fastening means comprises elongated bolts disposed through said apertures, and wherein all of said apertures have a diameter which is greater than that of said bolts for enabling the centering of said sleeve relative to said conductor.

6. The voltage transformer recited in claim 5, wherein siad first fastening shoulder, fastening projection and coupling member, and said second fastening shoulder and support member, respectively, include additional apertures alignable so as to form a common centering aperture for said coupling means and said support means, and further comprising a plurality of elongated centering pins disposed within said centering apertures for securing said sleeve in a position centered with respect to said conductor.

7. The voltage transformer recited in claim 4, further comprising tubular end sleeves disposed at each end of said sleeve and forming guard ring electrodes, and means for mounting said end sleeves at said ends of said sleeve and electrically insulating said end sleeves from said sleeve.

8. The voltage transformer recited in claim 7, wherein said mounting and insulating means comprises a first fastening lug coupled to one of said end sleeves, a first spacer member fabricated of electrical insulation material interposed between said first fastening shoulder and said lug, said lug and spacer member also including apertures extending therethrough and alignable with said apertures in said coupling member and first fastening shoulder for receiving said fastening means, and a second fastening lug coupled to the other end sleeve, and a second spacer member fabricated of electrical insulation material interposed between said second fastening shoulder and said lug, said second lug and spacer member also including apertures extending therethrough alignable with said apertures in said second fastening shoulder and said support member for receiving said fastening means.

9. The voltage transformer recited in claim 7, wherein said mounting and insulating means comprises flanges integrally formed with said end sleeves and including apertures extending therethrough for receiving said fastening means, and spacer rings fabricated of electrical insulation material disposed in said flange apertures and adjacent thereto in engagement with said flanges for electrically insulating said fastening means from said end sleeves.

\* \* \* \* \*